(12) United States Patent
Tanaka

(10) Patent No.: US 10,340,875 B2
(45) Date of Patent: Jul. 2, 2019

(54) ELECTRONIC COMPONENT

(71) Applicant: Murata Manufacturing Co., Ltd., Nagaokakyo-shi, Kyoto-fu (JP)

(72) Inventor: Akira Tanaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/713,780

(22) Filed: Sep. 25, 2017

(65) Prior Publication Data

US 2018/0013396 A1 Jan. 11, 2018

Related U.S. Application Data

(63) Continuation of application No. PCT/JP2016/050496, filed on Jan. 8, 2016.

(30) Foreign Application Priority Data

Mar. 27, 2015 (JP) ................. 2015-066094

(51) Int. Cl.
*H03H 7/09* (2006.01)
*H03H 7/01* (2006.01)
(Continued)

(52) U.S. Cl.
CPC ....... *H03H 7/1775* (2013.01); *H01F 17/0013* (2013.01); *H01G 4/40* (2013.01);
(Continued)

(58) Field of Classification Search
CPC ............. H03H 2001/0085; H03H 7/09; H03H 7/0115; H03H 7/1775
(Continued)

(56) References Cited

U.S. PATENT DOCUMENTS 6,424,235 B1 7/2002 Kato
2007/0241839 A1* 10/2007 Taniguchi ............... H03H 7/09
333/185

(Continued)

FOREIGN PATENT DOCUMENTS

JP 5-136644 A 6/1993
JP 2000-323902 A 11/2000
(Continued)

OTHER PUBLICATIONS

Official Communication issued in International Patent Application No. PCT/JP2016/050496, dated Feb. 16, 2016.

*Primary Examiner* — Rakesh B Patel

(74) *Attorney, Agent, or Firm* — Keating & Bennett LLP

(57) ABSTRACT

An electronic component includes a second inductor including a second inductor conductor that includes a first coupling portion electrically coupled to a second capacitor conductor and a second coupling portion electrically coupled to a second ground conductor, and when viewed in a plan view from a lamination direction, a first region surrounded by a first inductor conductor and the second inductor conductor is smaller in area than a second region surrounded by a third inductor conductor layer and the second inductor conductor, and a second region forming portion, which is included in the second inductor conductor and surrounds the second region, and a first region forming portion, which is included in the second inductor conductor and surrounds the first region, are electrically coupled in series in this order on a path from the first coupling portion to the second coupling portion.

17 Claims, 7 Drawing Sheets

(51) Int. Cl.
    *H01G 4/40*           (2006.01)
    *H03H 7/075*         (2006.01)
    *H01F 17/00*         (2006.01)
    *H03H 1/00*          (2006.01)

(52) U.S. Cl.
    CPC ........ *H03H 7/0115* (2013.01); *H03H 7/0161* (2013.01); *H03H 7/075* (2013.01); *H03H 7/09* (2013.01); *H01F 2017/0026* (2013.01); *H03H 2001/0085* (2013.01)

(58) Field of Classification Search
    USPC ................................................. 333/175, 185
    See application file for complete search history.

(56) References Cited

U.S. PATENT DOCUMENTS

2010/0171568 A1    7/2010  Taniguchi
2015/0318593 A1*  11/2015  Imamura .............. H03H 7/0115
                                                  333/175

FOREIGN PATENT DOCUMENTS

JP        2003-045723 A     2/2003
WO      2009/041294 A1   4/2009

* cited by examiner

ELECTRONIC COMPONENT

CROSS REFERENCE TO RELATED APPLICATIONS

This application claims the benefit of priority to Japanese Patent Application No. 2015-066094 filed on Mar. 27, 2015 and is a Continuation Application of PCT Application No. PCT/JP2016/050496 filed on Jan. 8, 2016. The entire contents of each application are hereby incorporated herein by reference.

BACKGROUND OF THE INVENTION

1. Field of the Invention

The present invention relates to electronic components and more specifically to electronic components each including first to third LC parallel resonators.

2. Description of the Related

As an invention related to a conventional electronic component, a laminated band pass filter described in International Publication No. WO 2009/041294 is known, for example. The laminated band pass filter includes first to third LC parallel resonators. The first LC parallel resonator includes a first inductor electrode that is opened on the left side and shaped like a square-cornered U. The second LC parallel resonator includes a second inductor electrode that is opened on the right side and shaped like a square-cornered U. The first inductor electrode and the second inductor electrode are in a line-symmetric relationship.

The third LC parallel resonator includes a third inductor electrode. The third inductor electrode is located farther down on the lower side than the first inductor electrode and the second inductor electrode, and when viewed from above in a plane, overlaps the first inductor electrode and the second inductor electrode. A first region surrounded by the first inductor electrode and the third inductor electrode and a second region surrounded by the second inductor electrode and the third inductor electrode are equal in area. The above-described first to third LC parallel resonators constitute the band pass filter.

In the laminated band pass filter described in International Publication No. WO 2009/041294, the characteristic impedance viewed from an input/output terminal on the side of the first LC parallel resonator and the characteristic impedance viewed from an input/output terminal on the side of the third LC parallel resonator deviate from each other. More specifically, the first region surrounded by the first inductor electrode and the third inductor electrode and the second region surrounded by the second inductor electrode and the third inductor electrode are equal in area. This causes the strength of magnetic coupling between the first inductor electrode and the third inductor electrode and the strength of magnetic coupling between the second inductor electrode and the third inductor electrode to be similar to each other.

One end of the third inductor electrode is electrically coupled to a ground electrode. A portion that surrounds the first region is positioned near one end of the third inductor electrode. Thus, in the portion that is included in the third inductor electrode and surrounds the first region, inductive coupling is strong. In contrast, the other end of the third inductor electrode is electrically coupled to a capacitor electrode. A portion that surrounds the second region is positioned near the other end of the third inductor electrode. Thus, in the portion that is included in the third inductor electrode and surrounds the second region, capacitive coupling is strong. Accordingly, the magnetic coupling between the first inductor electrode and the third inductor electrode is stronger than the magnetic coupling between the second inductor electrode and the third inductor electrode. As a result, in the laminated band pass filter described in International Publication No. WO 2009/041294, the characteristic impedance viewed from the input/output terminal on the side of the first LC parallel resonator and the characteristic impedance viewed from the input/output terminal on the side of the third LC parallel resonator deviate from each other.

SUMMARY OF THE INVENTION

Preferred embodiments of the present invention provide electronic components that significantly reduce or prevent an occurrence of deviation in input impedance measured from each input/output terminal.

An electronic component according to a preferred embodiment of the present invention includes a laminate including a plurality of insulator layers laminated in a lamination direction; and a first LC parallel resonator, a second LC parallel resonator, and a third LC parallel resonator, the first LC parallel resonator including a first inductor and a first capacitor, the third LC parallel resonator including a third inductor and a third capacitor, the second LC parallel resonator including a second inductor and a second capacitor coupled to each other in parallel, the first inductor and the third inductor respectively including a first inductor conductor and a third inductor conductor that are wound when viewed in a plane from the lamination direction, the second capacitor including a second capacitor conductor and a second ground conductor that face each other, the second inductor including a second inductor conductor that includes a first coupling portion and a second coupling portion, the first coupling portion being electrically coupled to the second capacitor conductor, the second coupling portion being electrically coupled to the second ground conductor, a first region surrounded by the first inductor conductor and the second inductor conductor being smaller in area than a second region surrounded by the third inductor conductor and the second inductor conductor when viewed in the lamination direction, a second region forming portion and a first region forming portion being electrically coupled in series in this order on a path from the first coupling portion to the second coupling portion, the second region forming portion being included in the second inductor conductor and surrounding the second region, the first region forming portion being included in the second inductor conductor and surrounding the first region.

According to various preferred embodiments of the present invention, deviations in input impedance measured from each input/output terminal are significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Electronic components according to preferred embodiments of the present invention will be described below with reference to the drawings.

Figure 1:
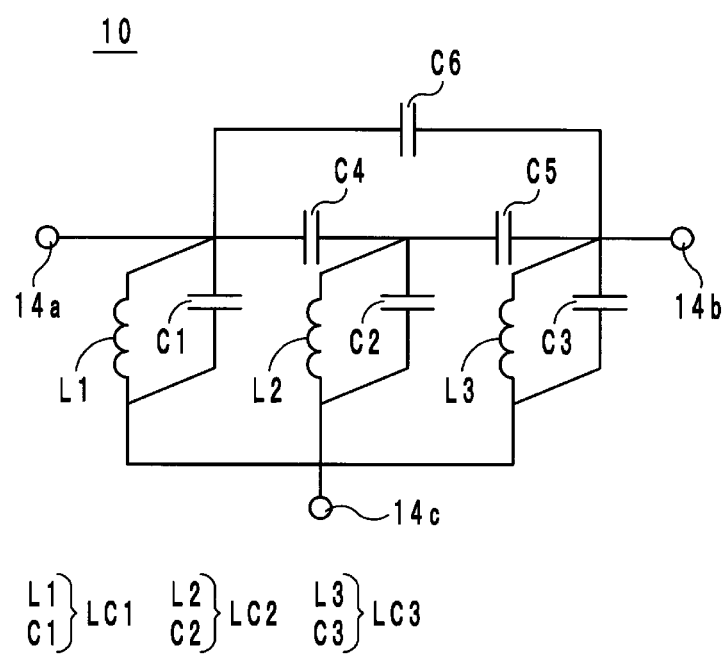
FIG. 1 is an equivalent circuit diagram of an electronic component 10 according to a preferred embodiment of the present invention.

A circuit configuration of an electronic component 10 according to a preferred embodiment of the present invention is described first with reference to the drawings. FIG. 1 is an equivalent circuit diagram of the electronic component 10 according to the present preferred embodiment.

The electronic component 10 is preferably a band pass filter and as illustrated in FIG. 1, includes LC parallel resonators LC1 to LC3, capacitors C4 to C6, and outer electrodes 14a to 14c.

The outer electrodes 14a and 14b are input/output terminals for high-frequency signals. The outer electrode 14c is a ground terminal coupled at a ground potential.

Between the outer electrode 14a and the outer electrode 14b, the capacitors C4 and C5 are coupled in series in this order. Further, the capacitor C6 is coupled in parallel to the capacitors C4 and C5.

The LC parallel resonator LC1, which is an example of a first LC parallel resonator, includes an inductor L1, which is an example of a first inductor, and a capacitor C1, which is an example of a first capacitor, and the inductor L1 and the capacitor C1 are coupled to each other in parallel. One end of the LC parallel resonator LC1 is coupled to a portion between the outer electrode 14a and the capacitor C4. The other end of the LC parallel resonator LC1 is coupled to the outer electrode 14c.

The LC parallel resonator LC2, which is an example of a second LC parallel resonator, includes an inductor L2, which is an example of a second inductor, and a capacitor C2, which is an example of a second capacitor, and the inductor L2 and the capacitor C2 are coupled to each other in parallel. One end of the LC parallel resonator LC2 is coupled to a portion between the capacitor C4 and the capacitor C5. The other end of the LC parallel resonator LC2 is coupled to the outer electrode 14c.

The LC parallel resonator LC3, which is an example of a third LC parallel resonator, includes an inductor L3, which is an example of a third inductor, and a capacitor C3, which is an example of a third capacitor, and the inductor L3 and the capacitor C3 are coupled to each other in parallel. One end of the LC parallel resonator LC3 is coupled to a portion between the capacitor C5 and the outer electrode 14b. The other end of the LC parallel resonator LC3 is coupled to the outer electrode 14c.

Further, the inductor L1 and the inductor L2 are magnetically coupled, and the inductor L2 and the inductor L3 are magnetically coupled.

The electronic component 10 configured as described above defines and functions as a band pass filter. More specifically, the impedances of the LC parallel resonators LC1 to LC3 are at a maximum at resonant frequencies thereof. Thus, the LC parallel resonators LC1 to LC3 do not pass high-frequency signals having frequencies around the resonant frequencies thereof. That is, high-frequency signals having frequencies around the resonant frequencies of the LC parallel resonators LC1 to LC3 flow between the outer electrode 14a and the outer electrode 14b without flowing from the outer electrode 14a or 14b to the outer electrode 14c. In contrast, at frequencies other than the frequencies around the resonant frequencies of the LC parallel resonators LC1 to LC3, the impedances of the LC parallel resonators LC1 to LC3 are relatively low. Thus, the frequencies other than the frequencies around the resonant frequencies of the LC parallel resonators LC1 to LC3 pass through the LC parallel resonators LC1 to LC3 and flow to the ground via the outer electrode 14c. As described above, the electronic component 10 defines and functions as a band pass filter that passes only high-frequency signals having frequencies around the resonant frequencies of the LC parallel resonators LC1 to LC3.

Figure 2:
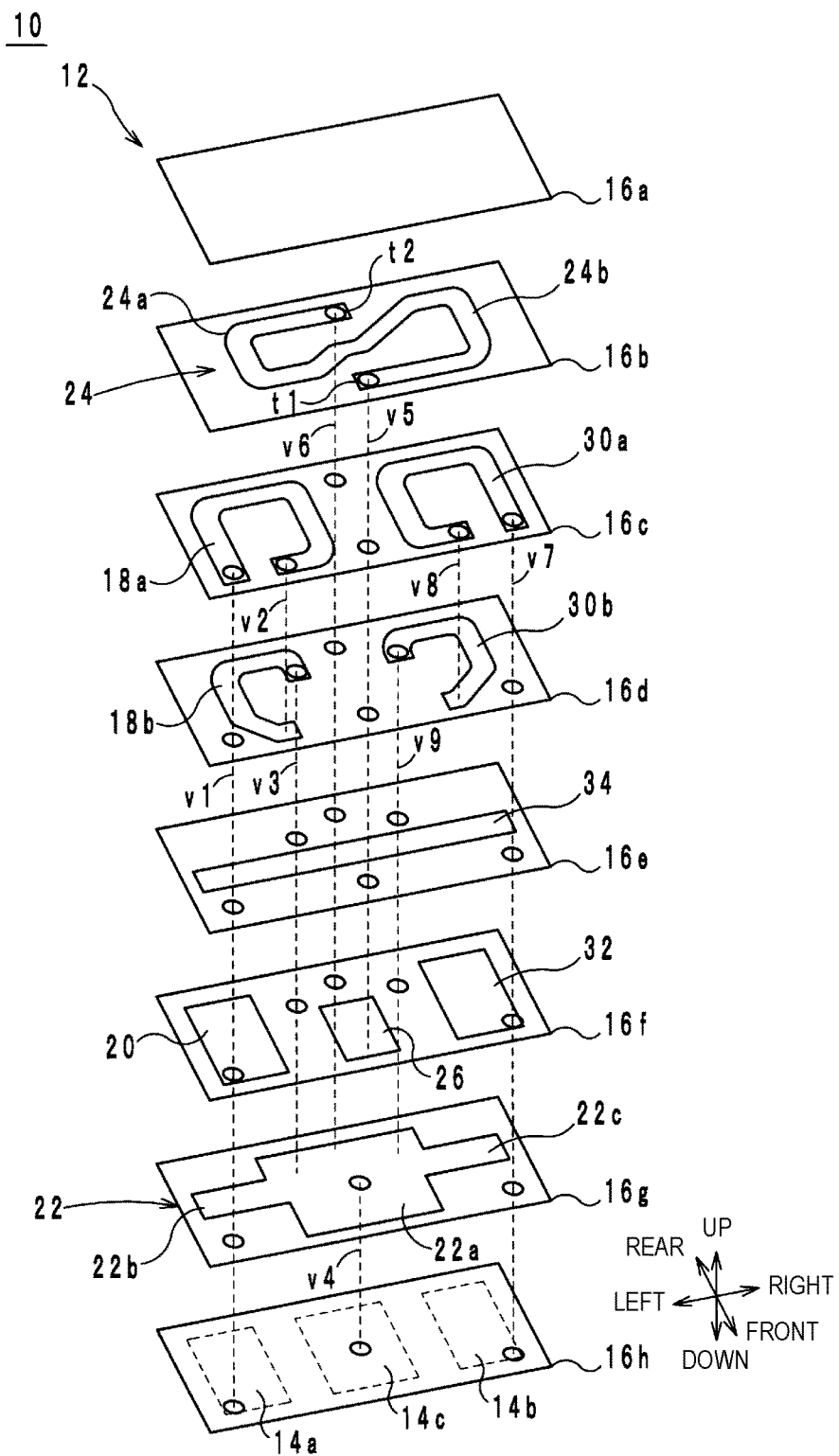
FIG. 2 is an exploded perspective view of the electronic component 10.
Figure 3:
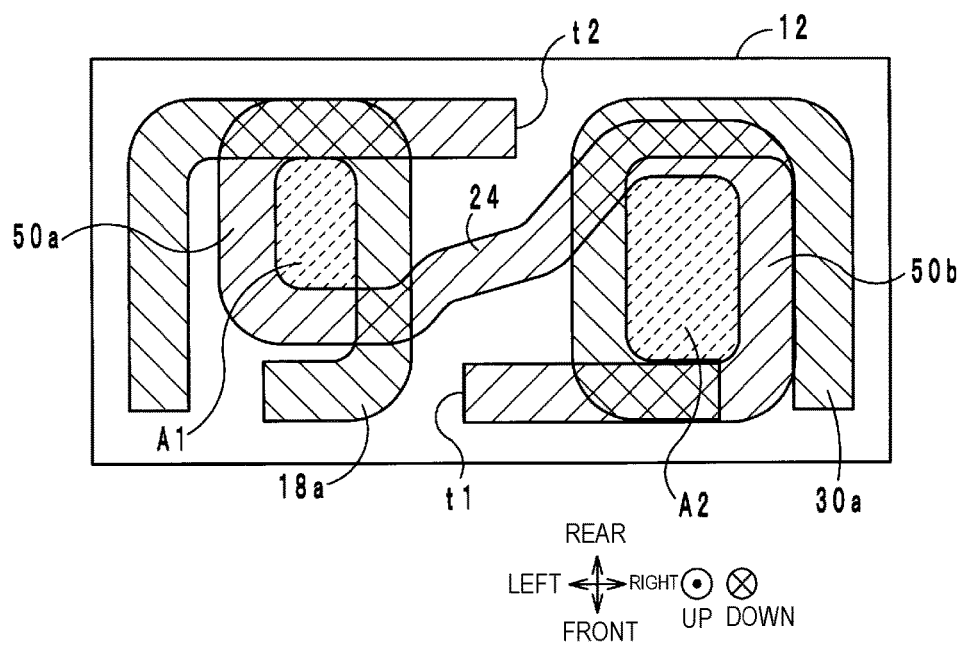
FIG. 3 illustrates the electronic component 10 viewed transparently from above.

A specific configuration of the electronic component 10 according to the present preferred embodiment is described next with reference to the drawings. FIG. 2 is an exploded perspective view of the electronic component 10. FIG. 3 illustrates the electronic component 10 viewed transparently from above. In FIG. 3, only inductor conductor layers 18a, 24, and 30a are shown. In the electronic component 10, the lamination direction of a laminate 12 is defined as the up-down direction. One side of the lamination direction defines the lower side and the other side of the lamination direction defines the upper side. Further, when the electronic component 10 is viewed from above in a plan view, the direction in which a long side of an upper surface of the electronic component 10 extends is defined as the left-right direction and the direction in which a short side of the upper surface of the electronic component 10 extends is defined as the front-rear direction.

As illustrated in FIG. 2 and FIG. 3, the electronic component 10 preferably includes the laminate 12, the outer electrodes 14a to 14c, the inductor conductor layer 18a, an inductor conductor layer 18b, the inductor conductor layers 24 and 30a, and an inductor conductor layer 30b, capacitor conductor layers 20, 26, 32, and 34, ground conductor layer 22, and via hole conductors v1 to v9.

As illustrated in FIG. 2, the laminate 12 preferably has a rectangular or substantially rectangular parallelepiped shape and includes insulator layers 16a to 16h, which are an example of a plurality of insulator layers, laminated in this order from the upper side to the lower side. The lower surface of the laminate 12 is a mounting surface. The mounting surface is a surface that faces a circuit board when the electronic component 10 is mounted on a circuit board.

The insulator layers 16a to 16h preferably have a rectangular or substantially rectangular shape with a long side that extends in the left-right direction when viewed from above in a plan view, and are made of, for example, ceramic. Hereinafter, the upper surfaces of the insulator layers 16a to 16h are referred to as top surfaces and the lower surfaces of the insulator layers 16a to 16h are referred to as reverse surfaces.

The outer electrodes 14a, 14c, and 14b are arranged so as to be aligned in this order from the left side to the right side on the lower surface of the laminate 12 and are not arranged on the front surface, the rear surface, the right surface, or the left surface of the laminate 12. The outer electrodes 14a to 14c preferably have rectangular or substantially rectangular shapes. The outer electrodes 14a to 14c are preferably made of, for example, Ni plating and Sn plating, or Ni plating and Au plating provided on a primary electrode made of silver or copper.

The inductor conductor layers 18a and 18b, which are an example of a plurality of the first inductor conductors, are arranged in the left-half regions on the top surfaces of the insulator layers 16c and 16d, respectively, and are conductor layers that are wound in a clockwise direction when viewed from above in a plan view. Hereinafter, end portions of the inductor conductor layers 18a and 18b on the upstream side in the clockwise direction are referred to as upstream ends, which are examples of a third coupling portion, and end portions of the inductor conductor layers 18a and 18b on the downstream side in the clockwise direction are referred to as downstream ends, which are examples of a fourth coupling portion.

The via hole conductor v2, which is an example of a first via hole conductor, penetrates the insulator layer 16c in the up-down direction and couples the downstream end of the inductor conductor layer 18a and the upstream end of the inductor conductor layer 18b. Accordingly, the inductor conductor layers 18a and 18b, and the via hole conductor v2 are included in the inductor L1. When viewed from above in a plan view, the inductor L1 has a spiral shape that is wound from the upper side to the lower side while in a clockwise direction.

The capacitor conductor layer 20, which is an example of a first capacitor conductor, is arranged in the left-half region of the top surface of the insulator layer 16f and is a conductor layer preferably having a rectangular or substantially rectangular shape. The ground conductor layer 22, which is an example of a first ground conductor, a second ground conductor, and a third ground conductor, is arranged on the top surface of the insulator layer 16g and is a conductor layer preferably having a cross shape. The ground conductor layer 22 includes a main portion 22a, and branch portions 22b and 22c. The main portion 22a is arranged centrally on the top surface of the insulator layer 16g and has a rectangular or substantially rectangular shape. The branch portions 22b and 22c project from the main portion 22a in the left and right directions, respectively. Further, the capacitor conductor layer 20 and the branch portion 22b face each other with the insulator layer 16f interposed therebetween. Accordingly, the capacitor conductor layer 20 and the ground conductor layer 22 are included in the capacitor C1. The via hole conductor v1 penetrates the insulator layers 16c to 16h in the up-down direction and couples the upstream end of the inductor conductor layer 18a, the capacitor conductor layer 20, and the outer electrode 14a. Accordingly, the upstream end of the inductor conductor layer 18a is electrically coupled to the capacitor conductor layer 20. Further, the via hole conductor v3 penetrates the insulator layers 16d to 16f in the up-down direction and couples the downstream end of the inductor conductor layer 18b and the ground conductor layer 22. Accordingly, the downstream end of the inductor conductor layer 18b is electrically coupled to the capacitor conductor layer with the via hole conductors v2 and v3, and the inductor conductor layer 18b interposed therebetween. Further, the via hole conductor v4 penetrates the insulator layers 16g and 16h in the up-down direction and couples the ground conductor layer 22 and the outer electrode 14c. Accordingly, the inductor L1 and the capacitor C1 are coupled in parallel and define the LC parallel resonator LC1. Moreover, one end of the LC parallel resonator LC1 is coupled to the outer electrode 14a and the other end of the LC parallel resonator LC1 is coupled to the outer electrode 14c.

The inductor conductor layers 30a and 30b, which are an example of a plurality of the third inductor conductors, the capacitor conductor layer 32, which is a third capacitor conductor, and the via hole conductors v7 to v9 are in a line-symmetric relationship with the inductor conductor layers 18a and 18b, the capacitor conductor layer 20, and the via hole conductors v1 to v3 with respect to a straight line extending in the front-rear direction through the center, which is the intersection point of the diagonal lines, of the laminate 12 when viewed from above in a plan view. Thus, the inductor conductor layers 30a and 30b are wound counterclockwise when viewed from above in a plan view. Thus, the direction in which the inductor conductor layers 18a and 18b are wound from the upstream ends to the downstream ends, which is an example of a first direction, and the direction in which the inductor conductor layers 30a and 30b are wound from the upstream ends to the downstream ends, which is an example of a third direction, are opposite to one another. Hereinafter, end portions of the inductor conductor layers 30a and 30b on the upstream side in the counterclockwise direction are referred to as upstream ends, which are examples of a fifth coupling portion, and end portions of the inductor conductor layers 30a and 30b on the downstream side in the counterclockwise direction are referred to as downstream ends, which are examples of a sixth coupling portion. Further descriptions of the configurations of the inductor conductor layers 30a and 30b, the capacitor conductor layer 32, and the via hole conductors v7 to v9 are omitted.

The inductor conductor layers 30a and 30b, which are examples of a third inductor conductor, and the via hole conductor v8, which is an example of a third via hole conductor, are included in the inductor L3. The capacitor conductor layer 32 and the ground conductor layer 22 are included in the capacitor C3.

The inductor conductor layer 24, which is an example of a second inductor conductor, is arranged on the top surface of the insulator layer 16b and is a line conductor layer having an S shape when viewed from above. The inductor conductor layer 24 is included in the inductor L2. Thus, the inductor conductor layer is preferably arranged further on the upper side than the inductor conductor layers 18a, 18b, 30a, and 30b. The inductor conductor layer 24 includes a left portion 24a and a right portion 24b. A boundary between the left portion 24a and the right portion 24b is in the center or approximate center of the insulator layer 16b.

When viewed from above in a plan view, the left portion 24a is wound clockwise from one end positioned centrally on the insulator layer 16b, which is hereinafter referred to as an upstream end, to the other end positioned near the center of a long side on the rear side of the insulator layer 16b, which is hereinafter referred to as a downstream end. Further, when viewed from above in a plan view, a portion of the left portion 24a faces a portion of the inductor conductor layer 18a with the insulator layer 16b interposed therebetween and also faces a portion of the capacitor conductor layers 20, 26, and 34. Accordingly, a portion of the left portion 24a, a portion of the inductor conductor layer 18a, and a portion of the capacitor conductor layer 20, 26, and 34 are included in the capacitor C4.

When viewed from above in a plan view, the right portion 24b is wound counterclockwise from one end positioned near the center of a long side on the front side of the insulator layer 16b, which is hereinafter referred to as an upstream end, to the other end positioned centrally on the insulator layer 16b, which is hereinafter referred to as a downstream end. The upstream end of the left portion 24a and the downstream end of the right portion 24b are coupled to each other. Hereinafter, the upstream end of the right portion 24b is referred to as an upstream end t1, which is an example of a first coupling portion, and the downstream end of the left portion 24a is referred to as a downstream end t2, which is an example of a second coupling portion. Further, when viewed from above in a plan view, a portion of the right portion 24b faces a portion of the inductor conductor layer 30a with the insulator layer 16b interposed therebetween and also faces a portion of the capacitor conductor layers 26, 32, and 34. Accordingly, a portion of the right portion 24b, a portion of the inductor conductor layer 30a, and a portion of the capacitor conductor layers 26, 32, and 34 are included in the capacitor C5.

Further, as illustrated in FIG. 2 and FIG. 3, the left portion 24a and the right portion 24b are not in a point-symmetric relationship with respect to the center or approximate center of the insulator layer 16b when viewed from above in a plane. More specifically, the left portion 24a is has a smaller inside diameter than the right portion 24b. Thus, when viewed from above in a plan view, a region A1 surrounded by the inductor conductor layer 18a and the left portion 24a of the inductor conductor layer 24, which is an example of a first region, is smaller in area than a region A2 surrounded by the inductor conductor layer 30a and the right portion 24b of the inductor conductor layer 24, which is an example of a second region. The region A1 is preferably surrounded by the inductor conductor layer 18a positioned closest to the inductor conductor layer 24 in the up-down direction, that is, positioned on the uppermost side of the inductor conductor layers 18a and 18b. The region A2 is preferably surrounded by the inductor conductor layer 30a positioned closest to the inductor conductor layer 24 in the up-down direction, that is, positioned on the uppermost side of the inductor conductor layers 30a and 30b.

Hereinafter, a portion that is included in the left portion 24a and surrounds the region A1, which is an example of a first region forming portion, is referred to as a region forming portion 50a and a portion that is included in the right portion 24b and surrounds the region A2, which is an example of a second region forming portion, is referred to as a region forming portion 50b. The region forming portion 50a is a portion in contact with the region A1 and the region forming portion 50b is a portion in contact with the region A2. The region forming portion 50b and the region forming portion 50a are electrically coupled in series in this order on a path from the upstream end t1 to the downstream end t2

Further, the direction in which the inductor conductor layer 18a is wound from the upstream end to the downstream end, which is an example of a first direction, is the same as the direction in which the region forming portion 50a is wound from the upstream end t1 to the downstream end t2, which is an example of a second direction, and preferably is a clockwise direction. Accordingly, the direction of current that flows to the inductor conductor layer 18a is the same as the direction of current that flows to the region forming portion 50a.

Moreover, the direction in which the inductor conductor layer 30a is wound from the upstream end to the downstream end, which is an example of the third direction, is the same as to the direction in which the region forming portion 50b is wound from the upstream end t1 to the downstream end t2, which is an example of a fourth direction, and preferably is a counterclockwise direction. Accordingly, the direction of current that flows to the inductor conductor layer 30a is the same as the direction of current that flows to the region forming portion 50b. Further, the direction of current that flows to the inductor conductor layer 18a and the region forming portion 50a and the direction of current that flows to the inductor conductor layer 30a and the region forming portion 50b are opposite to one another.

The capacitor conductor layer 26, which is an example of a second capacitor conductor, is preferably a rectangular or substantially rectangular conductor layer arranged centrally on the top surface of the insulator layer 16f. The capacitor conductor layer 26 and the main portion 22a of the ground conductor layer 22 face each other with the insulator layer 16f interposed therebetween. Accordingly, the capacitor conductor layer 26 and the ground conductor layer 22 are included in the capacitor C2.

The via hole conductor v5 penetrates the insulator layers 16b to 16e in the up-down direction and couples the upstream end t1 of the inductor conductor layer 24 and the capacitor conductor layer 26. That is, the upstream end t1 of the inductor conductor layer 24 is electrically coupled to the capacitor conductor layer 26. The via hole conductor v6 penetrates the insulator layers 16b to 16f in the up-down direction and couples the downstream end t2 of the inductor conductor layer 24 and the ground conductor layer 22. That is, the downstream end t2 of the inductor conductor layer 24 is electrically coupled to the ground conductor layer 22. Accordingly, the inductor L2 and the capacitor C2 are coupled in parallel and define the LC parallel resonator LC2. Moreover, the via hole conductor v4 couples the ground conductor layer 22 and the outer electrode 14c, and thus, the other end of the LC parallel resonator LC2 is electrically coupled to the outer electrode 14c.

The capacitor conductor layer 34 is arranged on the top surface of the insulator layer 16e and is a belt-shaped conductor layer that extends in the left-right direction. The capacitor conductor layer 34 faces the capacitor conductor layers 20 and 32 with the insulator layer 16e interposed therebetween. Accordingly, capacitance is generated between the capacitor conductor layer 20 and the capacitor conductor layer 32 with the capacitor conductor layer 34 interposed therebetween. Thus, the capacitor conductor layers 20, 32, and 34 are included in the capacitor C6.

The inductor conductor layers 18a, 18b, 24, 30a, and 30b, the capacitor conductor layers 20, 26, 32, and 34, the ground conductor layer 22, and the via hole conductors v1 to v9 are made of, for example, a conductive material, such as silver or copper.

The electronic component 10 significantly reduces or prevents the occurrence of deviation between the input impedance measured from the outer electrode 14a and the input impedance measured from the outer electrode 14b. More specifically, the inductor conductor layer 24 includes the upstream end t1 that is electrically coupled to the capacitor conductor layer 26, and the downstream end t2 that is electrically coupled to the ground conductor layer 22. Thus, since the direction of current that flows to the via hole conductor v5 coupled to the upstream end t1 and the direction of current that flows to the via hole conductor v9 are different from each other, magnetic flux caused in the via hole conductor v5 and magnetic flux caused in the via hole conductor v9 are in directions that cancel each other out, and in the region forming portion 50b near the upstream end t1, capacitive coupling is stronger than inductive coupling, and since the direction of current that flows to the via hole conductor v6 coupled to the downstream end t2 and the direction of current that flows to the via hole conductor v3 are the same as one another, magnetic flux caused in the via hole conductor v6 and magnetic flux caused in the via hole conductor v3 are in the same direction and, accordingly, in the region forming portion 50a near the downstream end t2, inductive coupling is stronger than capacitive coupling. Thus, the region forming portion 50a and the inductor conductor layer 18a are easily magnetically coupled.

So, in the electronic component 10, when viewed from above in a plan view, the region A1 surrounded by the inductor conductor layer 18a and the inductor conductor layer 24 is smaller in area than the region A2 surrounded by the inductor conductor layer 30a and the inductor conductor layer 24. Accordingly, magnetic coupling between the region forming portion 50a and the inductor conductor layer 18a is significantly reduced or prevented. As a result, the strength of magnetic coupling between the region forming portion 50a and the inductor conductor layer 18a and the strength of magnetic coupling between the region forming portion 50b and the inductor conductor layer 30a are similar to each other. So, the input impedance measured from the outer electrode 14a and the input impedance measured from the outer electrode 14b are similar to each other.

Figure 4:
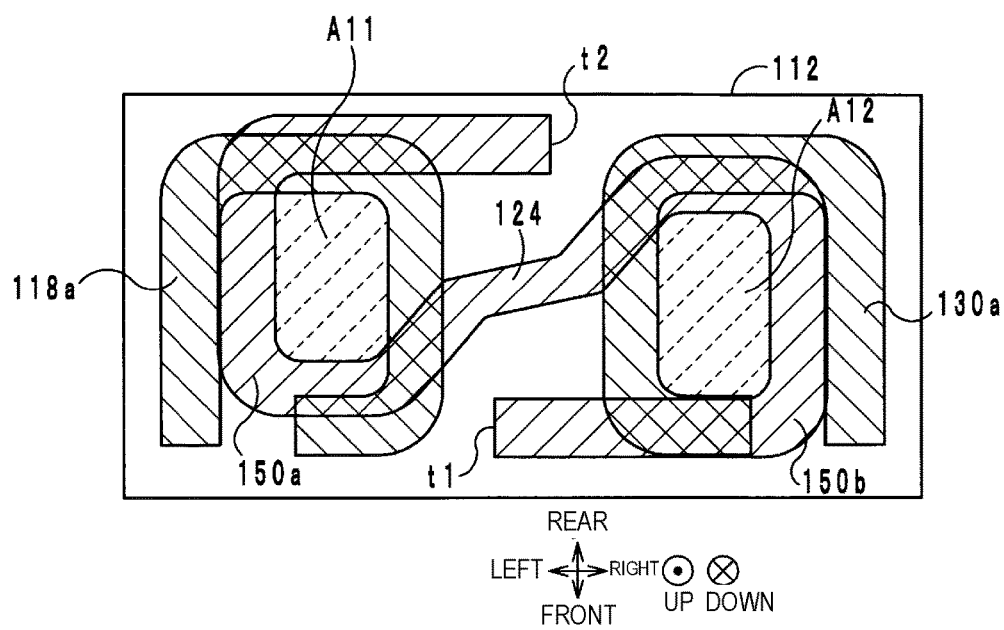
FIG. 4 illustrates an electronic component 110 according to a comparative example viewed transparently from above.

The inventor of the present invention has conducted computer simulations described below to clarify the effects achieved by the electronic component 10. FIG. 4 illustrates an electronic component 110 according to a comparative example viewed transparently from above. In the electronic component 110, 100 is added to the respective reference numerals of the elements in the electronic component 10 and used for the reference numerals of the elements corresponding to those in the electronic component 10.

Specifically, a first model and a second model that have the respective configurations of the electronic components 10 and 110 were prepared. The electronic component 110 is different from the electronic component 10 in the shape of an inductor conductor layer 124. More specifically, the inductor conductor layer 124 has a point-symmetric configuration. Accordingly, a region A11 surrounded by the inductor conductor layer 124 and an inductor conductor layer 118a and a region A12 surrounded by the inductor conductor layer 124 and an inductor conductor layer 130a are equal or substantially equal in area.

Figure 5A:
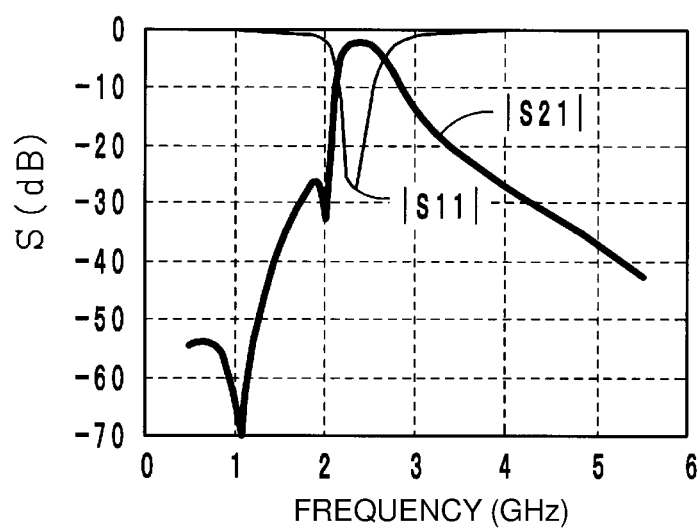
FIG. 5A is a graph that illustrates bandpass characteristics |S21| and reflection characteristics |S11| of a first model.
Figure 5B:
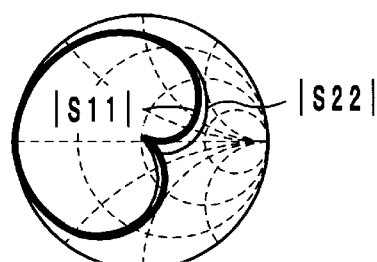
FIG. 5B is a Smith chart of the first model.
Figure 5C:
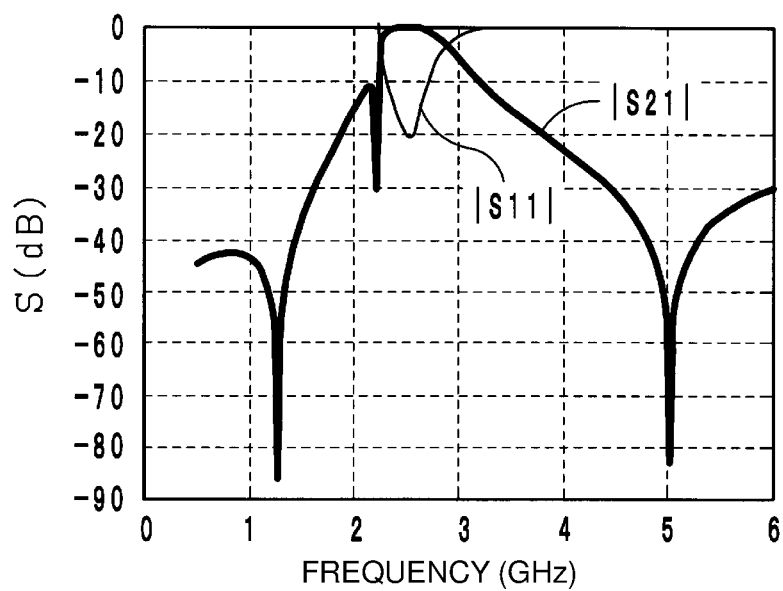
FIG. 5C is a graph that illustrates bandpass characteristics |S21| and reflection characteristics |S11| of a second model.
Figure 5D:
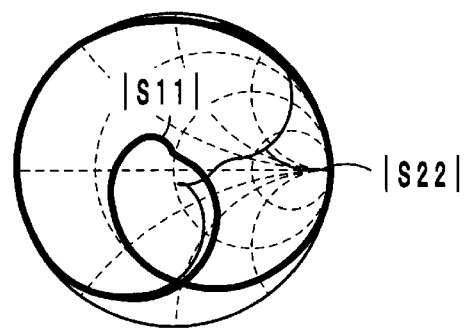
FIG. 5D is a Smith chart of the second model.

The inventor of the present invention caused a computer to compute bandpass characteristics |S21| and reflection characteristics |S11| of the first model and the second model and to compute the input impedance viewed from the outer electrodes 14a and 114a and the input impedance viewed from the outer electrodes 14b and 114b. FIG. 5A is a graph that illustrates the bandpass characteristics |S21| and the reflection characteristics |S11| of the first model. FIG. 5B is a Smith chart that illustrates the input impedance of the first model. In the Smith chart of FIG. 5B, the frequencies of high-frequency signals are changed from about 0.5 GHz to about 5.5 GHz. FIG. 5C is a graph that illustrates the bandpass characteristics |S21| and the reflection characteristics |S11| of the second model. FIG. 5D is a Smith chart that illustrates the input impedance of the second model. In the Smith chart of FIG. 5C, the frequencies of high-frequency signals are changed from about 0.5 GHz to about 6.0 GHz. In FIG. 5A and FIG. 5C, the longitudinal axis indicates the bandpass characteristics and the reflection characteristics while the lateral axis indicates the frequencies.

FIG. 5D demonstrates that in the second model, a change in impedance on the side of the outer electrode 114a, which is not illustrated, and a change in impedance on the side of the outer electrode 114b, which is not illustrated, are not the same. In contrast, FIG. 5B demonstrates that in the first model, a change in impedance on the side of the outer electrode 14a and a change in impedance on the side of the outer electrode 14b are the same or substantially the same. Accordingly, it is demonstrated that in the electronic component 10, the input impedance measured from the outer electrode 14a and the input impedance measured from the outer electrode 14b are similar to each other.

Moreover, FIG. 5A and FIG. 5C demonstrate that in the pass band of about 2.2 GHz to about 3.0 GHz, the reflection characteristics of the electronic component 10 are smaller than the reflection characteristics of the electronic component 110. Accordingly, it is demonstrated that in the electronic component 10, the input impedance measured from the outer electrode 14a and the input impedance measured from the outer electrode 14b are similar to each other and the impedances are matched, and thus, reflection of a high-frequency signal in the pass band is significantly reduced or prevented.

Further, in the electronic component 10, magnetic coupling of the inductor conductor layer 24 to a conductor layer other than the inductor conductor layers 18a and 30a is significantly reduced or prevented. More specifically, the region A1 is surrounded by the inductor conductor layer 18a positioned closest to the inductor conductor layer 24 in the up-down direction. The region A2 is surrounded by the inductor conductor layer 30a positioned closest to the inductor conductor layer 24 in the up-down direction. Accordingly, the inductor conductor layer 24 is magnetically coupled to the inductor conductor layers 18a and 30a. Thus, it is difficult for the inductor conductor layer 24 to be magnetically coupled to a conductor layer located further on the lower side than the inductor conductor layers 18a and 30a.

Figure 6:
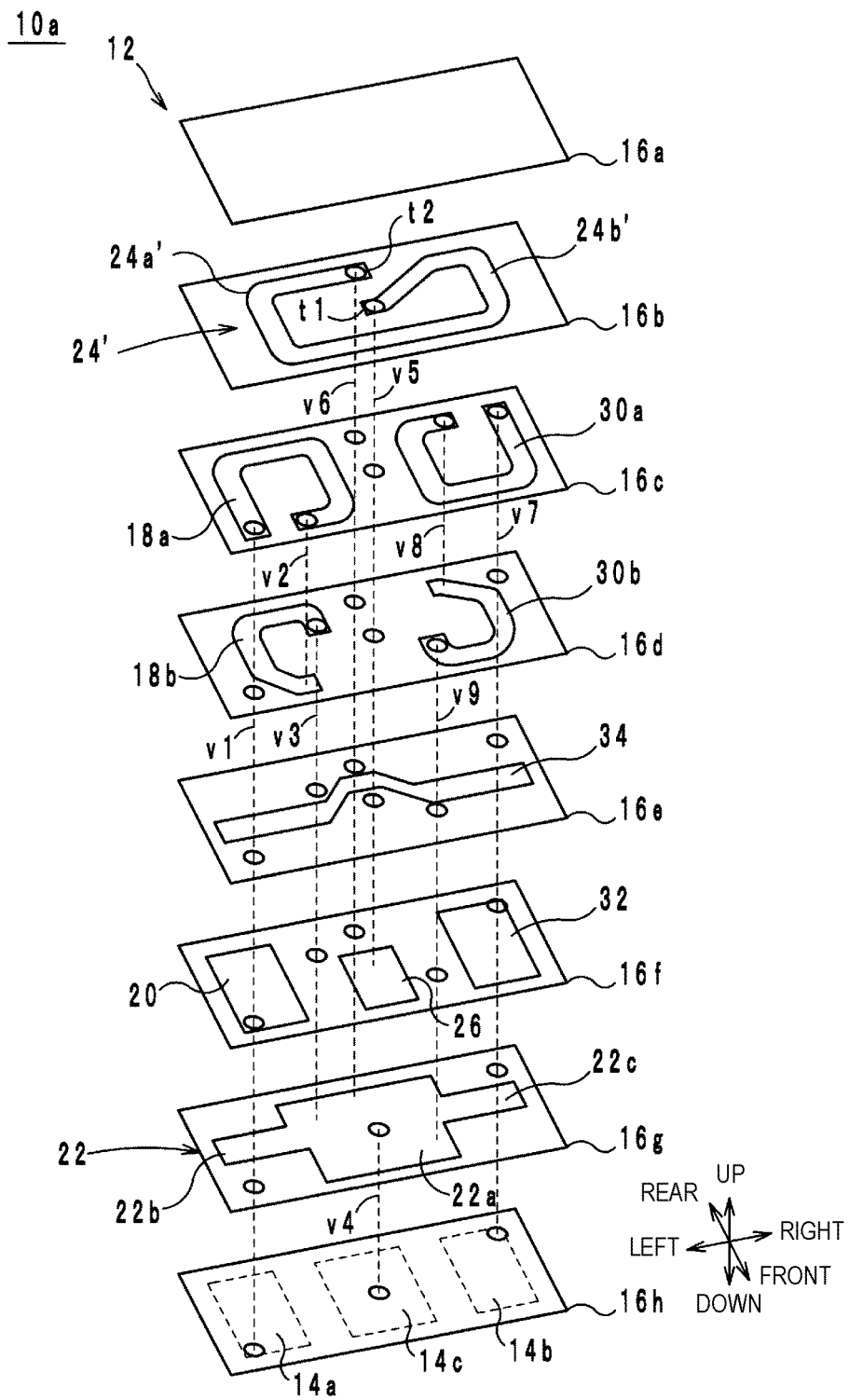
FIG. 6 is an exploded perspective view of an electronic component 10a according to a modified example of a preferred embodiment of the present invention.
Figure 7:
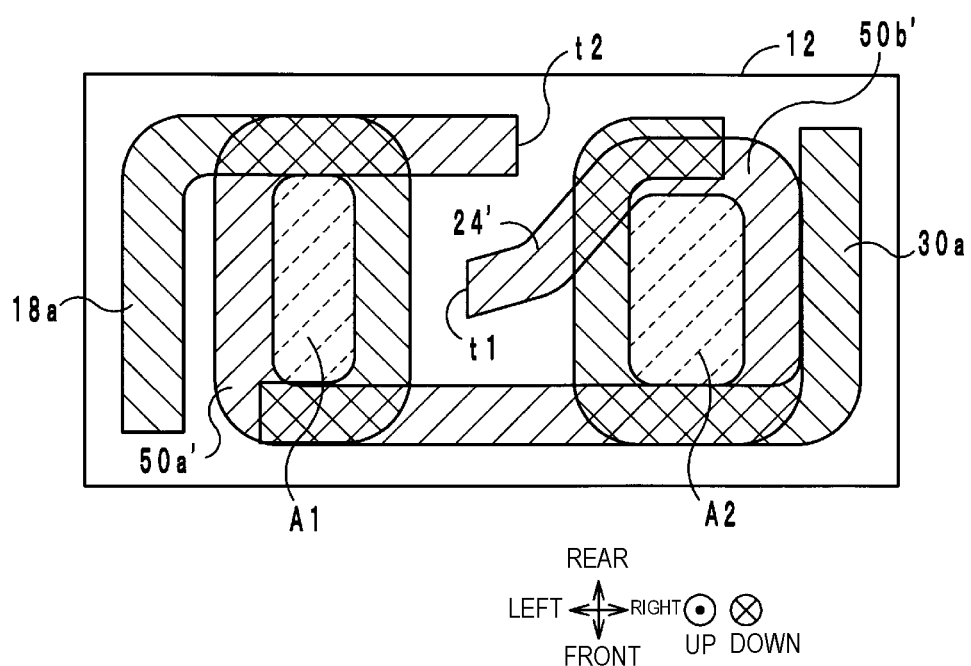
FIG. 7 illustrates the electronic component 10a viewed transparently from above.

An electronic component according to a modified example of a preferred embodiment of the present invention is described below with reference to the drawings. FIG. 6 is an exploded perspective view of an electronic component 10a according to the modified example. FIG. 7 illustrates the electronic component 10a viewed transparently from above.

The electronic component 10a is different from the electronic component 10 in two points, which are the direction of the LC parallel resonator LC3 and the shape of an inductor conductor layer 24'. More specifically, when viewed from above in a plan view, the inductor conductor layers 30a and 30b and the via hole conductors v7 to v9 in the electronic component 10a are obtained by rotating the inductor conductor layers 30a and 30b and the via hole conductors v7 to v9 in the electronic component 10 by 180°. That is, in the electronic component 10a, the inductor conductor layers 30a and 30b, when viewed from above in a plan view, the capacitor conductor layer 32, and the via hole conductors v7 to v9 are in a point-symmetric relationship with the inductor conductor layers 18a and 18b, the capacitor conductor layer 20, and the via hole conductors v1 to v3 with respect to the center of the laminate 12, which is the intersection point of the diagonal lines. So, the direction in which the inductor conductor layers 18a and 18b are wound from the upstream ends to the downstream ends, which is an example of the first direction, and the direction in which the inductor conductor layers 30a and 30b are wound from the upstream ends to the downstream ends, which is an example of the third direction, are the same.

Further, the inductor conductor layer 24' is a line conductor layer that is provided on the top surface of the insulator layer 16b and has a shape in which a portion of a rectangle is cut out. The inductor conductor layer 24' is included in the inductor L2 and includes a left portion 24a' and a right portion 24b'.

When viewed from above in a plan view, the left portion 24a' is wound clockwise from one end positioned near the center of a long side on the front side of the insulator layer 16b, which is hereinafter referred to as an upstream end, to the other end positioned near the center of a long side on the rear side of the insulator layer 16b, which is hereinafter referred to as a downstream end.

When viewed from above in a plan view, the right portion 24b' is wound clockwise from one end positioned centrally on the insulator layer 16b, which is hereinafter referred to as an upstream end, to the other end positioned near the center of the long side on the front side of the insulator layer 16b, which is hereinafter referred to as a downstream end.

The upstream end of the left portion 24a' and the downstream end of the right portion 24b' are coupled. Hereinafter, the upstream end of the right portion 24b' is referred to as the upstream end t1 and the downstream end of the left portion 24a' is referred to as the downstream end t2. The upstream end t1 is coupled to the capacitor conductor layer 26 with the via hole conductor v5 interposed therebetween. The downstream end t2 is coupled to the ground conductor layer 22 with the via hole conductor v6 interposed therebetween.

Further, as illustrated in FIG. 6 and FIG. 7, when viewed from above in a plan view, the left portion 24a' and the right portion 24b' are not in a line-symmetric relationship with respect to the straight line that passes through the center of the insulator layer 16b in the front-rear direction. More specifically, the left portion 24a' has a smaller inside diameter than the right portion 24b'. Accordingly, when viewed from above in a plan view, the region A1 surrounded by the inductor conductor layer 18a and the left portion 24a' of the inductor conductor layer 24' is smaller in area than the region A2 surrounded by the inductor conductor layer 30a and the right portion 24b' of the inductor conductor layer 24'.

Hereinafter, a portion that is included in the left portion 24a' and surrounds the region A1 is referred to as a region forming portion 50a' and a portion that is included in the right portion 24b' and surrounds the region A2 is referred to as a region forming portion 50b'. The region forming portion 50b' and the region forming portion 50a' are electrically coupled in series in this order on a path from the upstream end t1 to the downstream end t2.

Further, the direction in which the inductor conductor layer 18a is wound from the upstream end to the downstream end, which is an example of the first direction, is the same as the direction in which the region forming portion 50a' is wound from the upstream end t1 to the downstream end t2, which is an example of the second direction, and is preferably a clockwise direction. Accordingly, the direction of current that flows to the inductor conductor layer 18a corresponds to the direction of current that flows to the region forming portion 50a'.

Moreover, the direction in which the inductor conductor layer 30a is wound from the upstream end to the downstream end, which is an example of a third direction, is the same as the direction in which the region forming portion 50b' is wound from the upstream end t1 to the downstream end t2, which is an example of the fourth direction, and is preferably a clockwise direction. Accordingly, the direction of current that flows to the inductor conductor layer 30a corresponds to the direction of current that flows to the region forming portion 50b'. Further, the direction of current that flows to the inductor conductor layer 18a and the region forming portion 50a' and the direction of current that flows to the inductor conductor layer 30a and the region forming portion 50b' are the same.

The electronic component 10a configured as described above provides the same action and effects as those provided by the electronic component 10.

The electronic components according to preferred embodiments of the present invention are not limited to the electronic component 10 or 10a, and may be changed within the scope of the gist thereof.

The structural elements and features of the electronic components 10 and 10a may be combined as desired.

The inductor L1 may include only one inductor conductor layer, 18a. Similarly, the inductor L2 may include only one inductor conductor layer, 30a.

Although the electronic components 10 and 10a each preferably include three-stage LC parallel resonators, LC parallel resonators of four or more stages may be included.

The outer electrodes 14a to 14c may be arranged not only on the under surface of the laminate 12 but may also be arranged on the front surface, the rear surface, the left surface, the right surface, the upper surface, and the under surface of the laminate 12. Specifically, the outer electrode 14a may cover the front surface of the left surface of the laminate 12 and may also cover portions of the front surface, the rear surface, the upper surface, and the under surface. The outer electrode 14b may cover the front surface of the right surface of the laminate 12 and may also cover portions of the front surface, the rear surface, the upper surface, and the under surface. In this case, the via hole conductors v1 and v7 are unnecessary and the upstream ends of the inductor conductor layers 18a and 30a are able to be directly coupled to the outer electrodes 14a and 14b.

The inductor conductor layers 24 and 24' may further be provided on the lower side than the inductor conductor layers 18b and 30b. In this case, the inductor conductor layers 24 and 24' are magnetically coupled to the inductor conductor layer 18b and 30b.

The via hole conductors v1, v2, v3, v5, v6, v7, and v8 may not be coupled to any end portions of the inductor conductor layers 18a, 18b, 24, 30a, and 30b.

The inductors L1 and L3 may each have a shape other than a spiral.

As described above, preferred embodiments of the present invention are useful for electronic components and, in particular, are excellent in their capability to significantly reduce or prevent the occurrence of deviation in input impedance measured from each input/output terminal.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An electronic component comprising:
   a laminate including a plurality of insulator layers laminated in a lamination direction; and
   a first LC parallel resonator, a second LC parallel resonator, and a third LC parallel resonator; wherein
   the first LC parallel resonator includes a first inductor and a first capacitor;
   the third LC parallel resonator includes a third inductor and a third capacitor;

the second LC parallel resonator includes a second inductor and a second capacitor coupled to each other in parallel;
the first inductor and the third inductor respectively include a first inductor conductor and a third inductor conductor that are wound when viewed in a plan view from the lamination direction;
the second capacitor includes a second capacitor conductor and a second ground conductor that face each other;
the second inductor includes a second inductor conductor that includes a first coupling portion and a second coupling portion, the first coupling portion being electrically coupled to the second capacitor conductor, the second coupling portion being electrically coupled to the second ground conductor;
a first region surrounded by the first inductor conductor and the second inductor conductor is smaller in area than a second region surrounded by the third inductor conductor and the second inductor conductor when viewed in the plan view from the lamination direction; and
a second region forming portion and a first region forming portion are electrically coupled in series in this order on a path from the first coupling portion to the second coupling portion, the second region forming portion being included in the second inductor conductor and surrounding the second region, the first region forming portion being included in the second inductor conductor and surrounding the first region.

2. The electronic component according to claim 1, wherein
the first inductor includes a plurality of the first inductor conductors and one or more first via hole conductors, and has a spiral shape that winds in the lamination direction as a result of the plurality of the first inductor conductors and the one or more first via hole conductors being coupled;
the third inductor includes a plurality of the third inductor conductors and one or more third via hole conductors, and has a spiral shape that winds in the lamination direction as a result of the plurality of the third inductor conductors and the one or more third via hole conductors being coupled;
the first region is surrounded by one of the plurality of the first inductor conductors that is positioned closest to the second inductor conductor in the lamination direction; and
the second region is surrounded by one of the plurality of the third inductor conductors that is positioned closest to the second inductor conductor in the lamination direction.

3. The electronic component according to claim 1, wherein
the first capacitor includes a first capacitor conductor and a first ground conductor that face each other;
the third capacitor includes a third capacitor conductor and a third ground conductor that face each other;
the first inductor conductor includes a third coupling portion and a fourth coupling portion, the third coupling portion being electrically coupled to the first capacitor conductor, the fourth coupling portion being electrically coupled to the first ground conductor;
the third inductor conductor includes a fifth coupling portion and a sixth coupling portion, the fifth coupling portion being electrically coupled to the third capacitor conductor, the sixth coupling portion being electrically coupled to the third ground conductor;
when viewed in the plan view from the lamination direction, a first direction in which the first inductor conductor is wound from the third coupling portion to the fourth coupling portion is the same as a second direction in which the first region forming portion is wound from the first coupling portion to the second coupling portion; and
when viewed in the plan view from the lamination direction, a third direction in which the third inductor conductor is wound from the fifth coupling portion to the sixth coupling portion is the same as a fourth direction in which the second region forming portion is wound from the first coupling portion to the second coupling portion.

4. The electronic component according to claim 3, wherein the second inductor conductor has an S shape when viewed from the lamination direction.

5. The electronic component according to claim 3, wherein the first direction and the third direction are opposite to each other.

6. The electronic component according to claim 5, wherein when viewed in the plan view from the lamination direction, the first inductor conductor and the third inductor conductor are in a line-symmetric relationship.

7. The electronic component according to claim 3, wherein the first direction and the third direction are the same.

8. The electronic component according to claim 7, wherein when viewed in the plan view from the lamination direction, the first inductor conductor and the third inductor conductor are in a point-symmetric relationship.

9. The electronic component according to claim 3, wherein the first ground conductor, the second ground conductor, and the third ground conductor are defined by a single ground conductor layer.

10. The electronic component according to claim 9, wherein the single ground conductor layer has a cross shape.

11. The electronic component according to claim 1, wherein
a surface positioned on one side of the lamination direction in the laminate is a mounting surface; and
the second inductor conductor is arranged farther from the mounting surface than the first inductor conductor and the third inductor conductor.

12. The electronic component according to claim 1, wherein the first inductor and the second inductor are magnetically coupled, and the second inductor and the third inductor are magnetically coupled.

13. The electronic component according to claim 1, wherein the second inductor conductor is disposed on a different one of the plurality of insulator layers than the first inductor conductor and the third inductor conductor.

14. The electronic component according to claim 1, wherein the first inductor includes a plurality of the first inductor conductors that are disposed on at least two of the plurality of insulator layers.

15. The electronic component according to claim 1, wherein the third inductor includes a plurality of the third inductor conductors that are disposed on at least two of the plurality of insulator layers.

16. The electronic component according to claim 1, wherein
the first inductor includes a plurality of the first inductor conductors that are disposed on at least two of the plurality of insulator layers; and the third inductor includes a plurality of the third inductor conductors that are disposed on the least two of the plurality of insulator layers.

17. An electronic component comprising:
a laminate including a plurality of insulator layers and conductor layers laminated in a lamination direction; and
a first LC parallel resonator, a second LC parallel resonator, and a third LC parallel resonator; wherein
the first LC parallel resonator includes a first inductor and a first capacitor;
the third LC parallel resonator includes a third inductor and a third capacitor;
the second LC parallel resonator includes a second inductor and a second capacitor coupled to each other in parallel;
the first inductor includes a first inductor conductor that is wound when viewed in a plan view from the lamination direction;
the third inductor includes a third inductor conductor that is wound when viewed in the plan view from the lamination direction;
the second capacitor includes a second capacitor conductor and a second ground conductor that face each other;
the second inductor includes a second inductor conductor that includes a first coupling portion and a second coupling portion, the first coupling portion being electrically coupled to the second capacitor conductor, the second coupling portion being electrically coupled to the second ground conductor; and
a first region surrounded by the first inductor conductor and the second inductor conductor is smaller in area than a second region surrounded by the third inductor conductor and the second inductor conductor when viewed in the plan view from the lamination direction.

* * * * *